US006933781B2

(12) United States Patent
Jaussi et al.

(10) Patent No.: US 6,933,781 B2
(45) Date of Patent: Aug. 23, 2005

(54) LARGE GAIN-BANDWIDTH AMPLIFIER, METHOD, AND SYSTEM

(75) Inventors: James E. Jaussi, Hillsboro, OR (US); Joseph T. Kennedy, Beaverton, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/426,766

(22) Filed: Apr. 30, 2003

(65) Prior Publication Data

US 2004/0217812 A1 Nov. 4, 2004

(51) Int. Cl.[7] .................................................. H03F 3/45
(52) U.S. Cl. ....................................... 330/253; 330/257
(58) Field of Search .......................... 330/98, 253, 254, 330/257, 258, 310, 311

(56) References Cited

U.S. PATENT DOCUMENTS 4,588,956 A * 5/1986 de Corlieu et al. ............. 330/2
4,623,799 A 11/1986 Nyman, Jr.
5,631,607 A 5/1997 Huijsing et al.
5,907,259 A * 5/1999 Yamada et al. ............. 327/563
6,081,133 A 6/2000 Hedberg
6,163,216 A 12/2000 Murray et al.
6,252,435 B1 * 6/2001 Wu et al. ...................... 327/65
6,304,106 B1 10/2001 Cecchi et al.
6,307,402 B1 10/2001 Hedberg
6,377,121 B1 * 4/2002 Giduturi ..................... 330/253
6,456,159 B1 * 9/2002 Brewer .......................... 330/9
6,756,847 B2 * 6/2004 Blecker et al. ............. 330/253
2002/0070804 A1 6/2002 Giduturi

FOREIGN PATENT DOCUMENTS

EP 0750391 A2 12/1996

OTHER PUBLICATIONS

Barrandon G., "Etage Amplificateur A Hautes Performance", *Nuclear Instruments and Methods, 86 (2),* North–Holland Publishing Company, Amterdam, NL, (Sep. 15, 1970), 317–321.

* cited by examiner

*Primary Examiner*—Henry Choe
(74) *Attorney, Agent, or Firm*—LeMoine Patent Services, PLLC

(57) ABSTRACT

An amplifier includes multiple stages. Early stages of the multi-stage amplifier have low gain and preserve bandwidth.

17 Claims, 11 Drawing Sheets

REFERENCE SELECT
DATA
REF$_{HI}$
REF$_{LO}$
1ST STAGE
2ND STAGE
3RD STAGE
120
130
140
150
510
500

LARGE GAIN-BANDWIDTH AMPLIFIER, METHOD, AND SYSTEM

FIELD

The present invention relates generally to amplifier circuits, and more specifically to amplifier circuits having a large gain-bandwidth product.

BACKGROUND

Semiconductor materials such as silicon and gallium-arsenide are commonly used to manufacture integrated circuits for use in electronics. These integrated circuits typically have many transistors that are used as building blocks for larger circuits such as amplifiers. A commonly used performance measure for amplifiers is the "gain-bandwidth product." The gain-bandwidth product describes an inverse relationship between gain and bandwidth above a certain operating frequency. In other words, amplifiers with a large gain-bandwidth product can amplify signals at higher frequencies than amplifiers with a small gain-bandwidth product.

The gain-bandwidth product of amplifiers is influenced by many factors, including the underlying semiconductor manufacturing process. For example, an amplifier circuit manufactured using one process may have a higher gain-bandwidth product than the same amplifier circuit manufactured using a different process. This may be problematic in situations where an amplifier designed using a process that supports a high gain-bandwidth product is shared with designers that desire the same amplifier performance, but use a process that does not support such a high gain-bandwidth product.

For the reasons stated above, and for other reasons stated below which will become apparent to those skilled in the art upon reading and understanding the present specification, there is a need in the art for alternate amplifiers.

DESCRIPTION OF EMBODIMENTS

Figure 1:
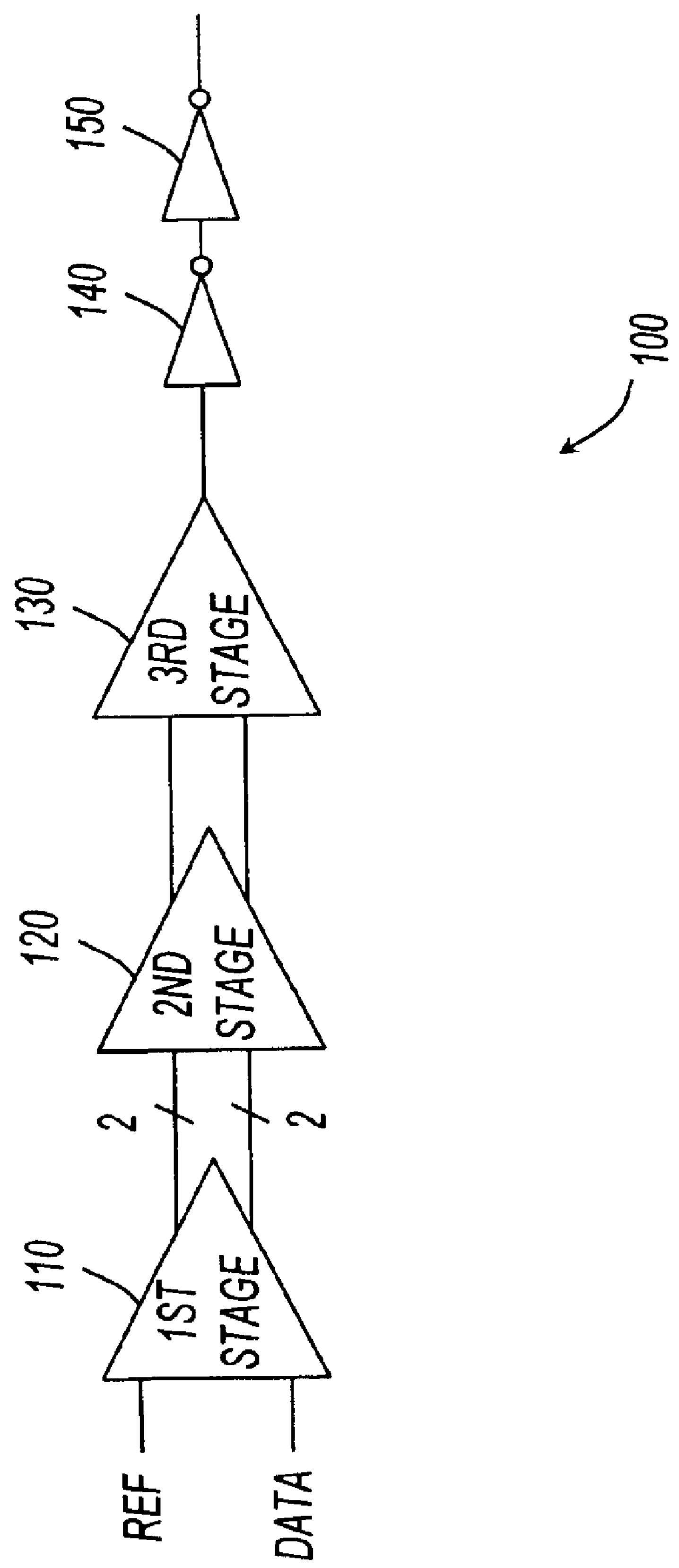
FIG. 1 shows a diagram of a receiver.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a receiver. Receiver 100 includes a multi-stage amplifier followed by inverters 140 and 150. The multi-stage amplifier includes first stage 110, second stage 120, and third stage 130. Receiver 100 receives a DATA signal and a REF signal on differential input nodes, and produces an output signal at standard logic levels.

The topology of receiver 100 provides for a higher overall gain-bandwidth product that cannot be achieved with a single stage amplifier having a comparable output amplitude. First stage 110 is a low gain differential input stage. First stage 110 can operate at higher frequencies than a single stage amplifier with the same gain-bandwidth product, because the gain of first stage 110 is lower than the gain of a single stage amplifier.

Second stage 120 receives four output signals from first stage 110 and sums currents at low impedance points, and also has low gain. Second stage 120, like first stage 110, preserves high bandwidth operation by having low gain. Third stage 130 is a high gain stage that operates as a level converter to increase the signal level. Inverters 140 and 150 are included to provide standard logic output levels and signal transition times, but are not necessary. For example, in some embodiments, inverters 140 and 150 provide complementary metal oxide semiconductor (CMOS) output signal. Various embodiments of first stage 110, second stage 120, and third stage 130 are described with reference to the figures that follow.

Figure 2:
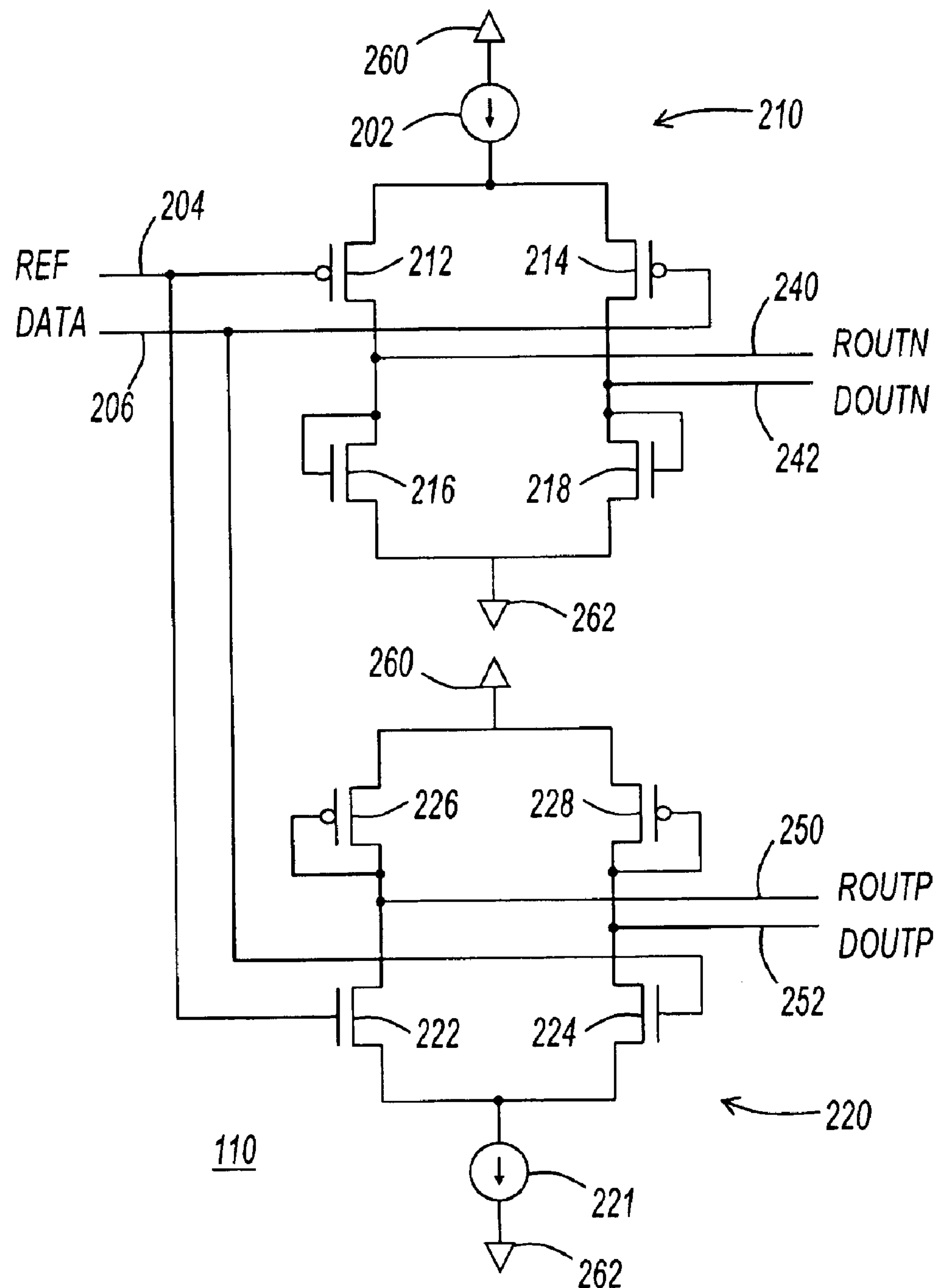
FIG. 2 shows a circuit schematic of an amplifier input stage.

FIG. 2 shows a circuit schematic of an amplifier input stage. Input stage 110 includes complementary differential input amplifiers 210 and 220. Amplifier 210 includes current source 202 and transistors 212, 214, 216, and 218. Transistors 212 and 214 form a first differential input pair of transistors that receive input signals from the differential input on nodes 204 and 206.

The transistors shown in FIG. 2 are shown as isolated gate transistors, and specifically as metal oxide semiconductor field effect transistors (MOSFETs). For example, transistors 212 and 214 are shown as P-type MOSFETs, and transistors 216 and 218 are shown as N-type MOSFETs. Other types of switching or amplifying elements may be utilized for the various transistors of input stage 110 without departing from the scope of the present invention. For example, the transistors of amplifier 210 may be junction field effect transistors (JFETs), bipolar junction transistors (BJTs), or any device capable of performing as described herein.

Transistors 216 and 218 are "diode-connected" transistors that provide "diode loads" to the differential input transistor pair formed by transistors 212 and 214. The term "diode-connected," as used herein, refers to a transistor that has a gate and a drain coupled together, as do transistors 216 and 218. The diode loads represent relatively low impedance loads that keep the gain of amplifier 210 low. In some embodiments, other load devices are used in input stage 110. For example, in some embodiments, resistors are used in place of transistors 216 and 218, and in other embodiments, diodes are used in place of transistors 216 and 218.

Output signals $R_{OUTN}$ and $D_{OUTN}$ are produced by amplifier 210 on nodes 240 and 242, respectively. The voltage difference between output signal $R_{OUTN}$ and lower power supply node 262 represents the gate-to-source voltage ($V_{GS}$) on transistor 216. The voltage difference between output signal $D_{OUTN}$ and lower power supply node 262 represents the gate-to-source voltage ($V_{GS}$) on transistor 218. $R_{OUTN}$ and $D_{OUTN}$ vary as current is switched between the two load devices based on the action of the differential input pair formed by transistors 212 and 214.

Amplifier 220 includes current source 221 and transistors 222, 224, 226, and 228. Transistors 222 and 224 form a second differential input pair of transistors that receive input signals from the differential input on nodes 204 and 206.

Transistors 226 and 228 are diode-connected transistors that provide diode loads to the differential input transistor pair formed by transistors 222 and 224. The diode loads represent relatively low impedance loads that keep the gain of amplifier 220 low.

Output signals $R_{OUTP}$ and $D_{OUTP}$ are produced by amplifier 220 on nodes 250 and 252, respectively. The voltage difference between reference node 260 and output signals $R_{OUTP}$ and $D_{OUTP}$ represent the source-to-gate voltages ($V_{SG}$) on the corresponding load devices, as current is switched between the two load devices based on the action of the differential input pair formed by transistors 222 and 224.

Amplifier 210 utilizes P-type transistors for the differential input pair of transistors, and amplifier 220 utilizes N-type transistors for the differential input pair. Accordingly, amplifiers 210 and 220 are referred to as "complementary."

The complementary amplifiers of input stage 110 provide a wide common mode input voltage range. When the input common mode voltage approaches the voltage value of the upper power supply node 260, amplifier 210 may cease to operate, in part because current source 202 may stop sourcing current to the rest of amplifier 210. As amplifier 210 shuts off, amplifier 220 continues to operate. The opposite is true when the input common mode voltage approaches the voltage value of the lower power supply node 262. As the input common mode voltage drops, amplifier 220 may cease to operate, but amplifier 210 will continue to operate.

Figure 3:
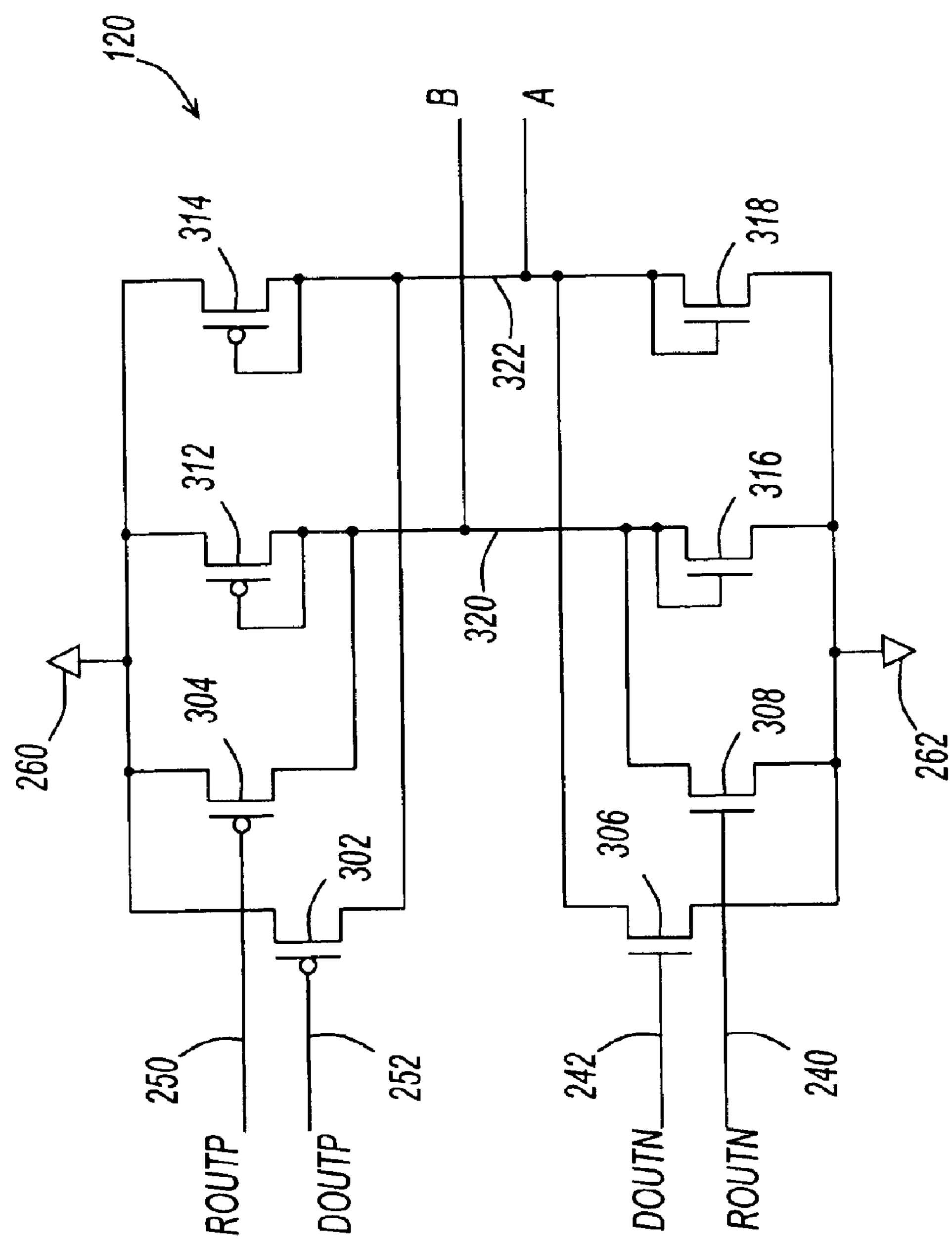
FIG. 3 shows a circuit schematic of an amplifier stage with active devices and current summing points.

FIG. 3 shows a circuit schematic of an amplifier stage with active devices and current summing points. Amplifier stage 120 includes current mirror transistors 302, 304, 306, and 308. Amplifier stage 120 also includes diode-connected transistors 312, 314, 316, and 318. Transistors 312 and 316 are coupled between upper power supply node 260 and lower power supply node 262 to form low impedance node 320, and transistors 314 and 318 are coupled between upper power supply node 260 and lower power supply node 262 to form low impedance node 322.

Transistors 302, 304, 306, and 308 are active devices that source current to low impedance nodes 320 and 322. The currents sourced by transistors 302 and 306 are summed at low impedance node 322, and the currents sourced by transistors 304 and 308 are summed at low impedance node 320. As such, low impedance nodes 320 and 322 are current summing points within a low gain amplifier stage.

Currents sourced by transistors 302, 304, 306, and 308 are influenced by the voltages on the corresponding gate nodes. For example, the signal $R_{OUTN}$ on node 240 influences the amount of current sourced by transistor 308. Referring now back to FIG. 2, $R_{OUTN}$ represents the gate-to-source voltage ($V_{GS}$) of diode-connected transistor 218. Because the same $V_{GS}$ is applied across transistors 216 (FIG. 2) and 308 (FIG. 3), transistors 308 operates as a current mirror and mirrors the current that flows drain-to-source in transistor 216. Transistors 302, 304, and 306 operate as current mirrors in a similar fashion.

The gain of amplifier stage 120 is low, due in part to the low impedance current summing nodes at 320 and 322. The active devices at the input to amplifier stage 120, and the low impedance current summing points combine to form an amplifier that preserves high bandwidth operation with low gain. Signals A and B form a differential output signal from amplifier stage 120 on nodes 322 and 320.

The operation of amplifier stage 120 preserves the wide common mode input range described above with reference to FIG. 2. If one of the complementary differential amplifiers in input stage 110 (FIG. 2) begins to shut off, the corresponding active devices in amplifier stage 120 will also begin to shut off, but the remaining actives devices will still operate. For example, as the input common mode voltage approaches the upper rail, amplifier 210 (FIG. 2) will begin to shut off, and $R_{OUTN}$ and $D_{OUTN}$ will drop below the threshold voltage of the diode connected transistors 216 and 218, and transistors 306 and 308 will shut off. During this time, however, transistors 302 and 304 will continue to operate. The opposite is also true. As transistors 302 and 304 shut off, transistors 306 and 308 still operate. This preserves the wide common mode input range of receiver 100 (FIG. 1).

Figure 4:
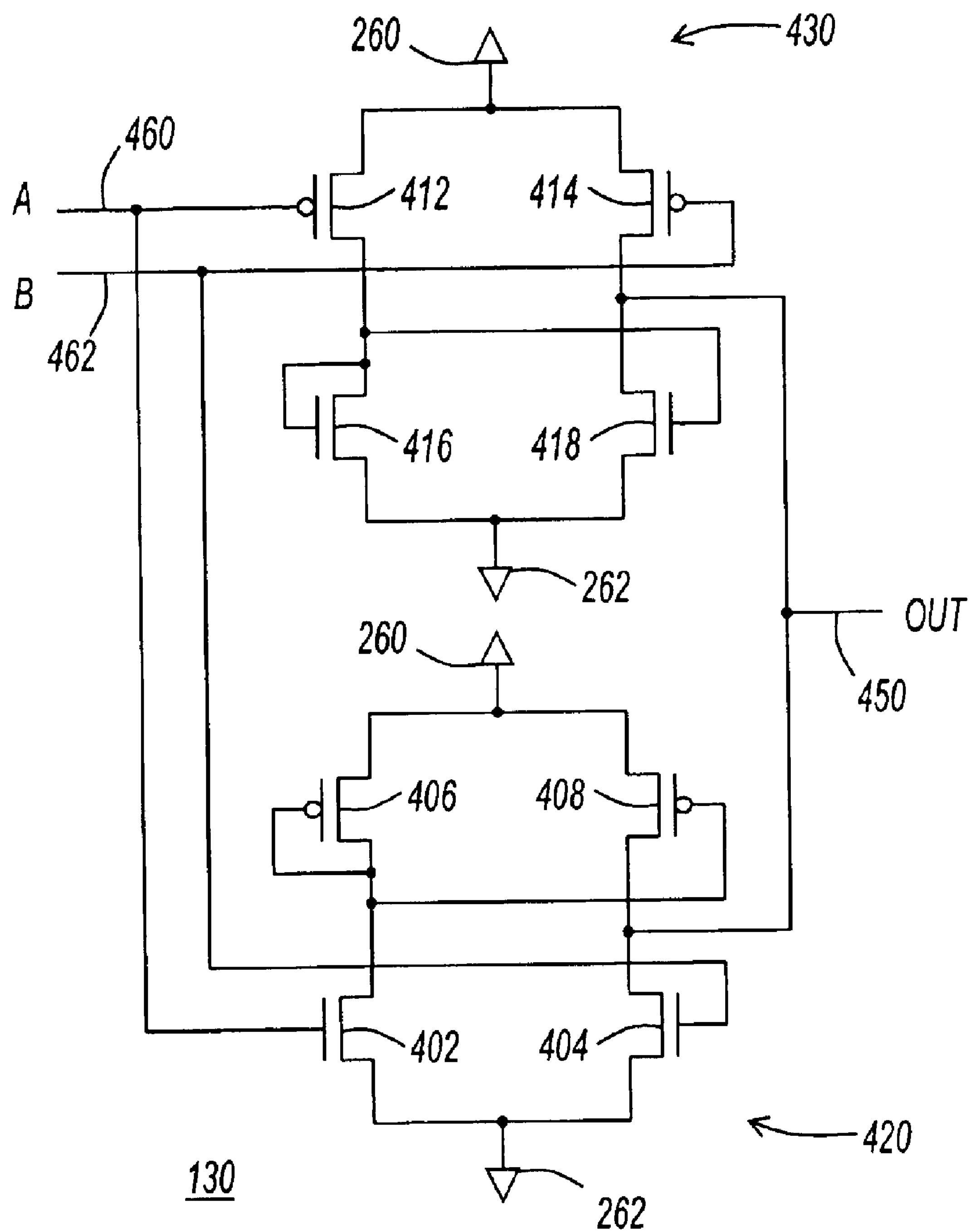
FIG. 4 shows a circuit schematic of a non-linear amplifier stage.

FIG. 4 shows a circuit schematic of a non-linear amplifier stage. Amplifier stage 130 includes complementary non-linear amplifiers 420 and 430. Amplifiers 420 and 430 include differential input pairs, a diode load and a load transistor coupled as a positive feedback device. For example, amplifier 420 includes differential pair of transistors 402 and 404, diode-connected transistor 406, and load transistor 408 coupled as a positive feedback device. Also for example, amplifier 430 includes differential pair of transistors 412 and 414, diode-connected transistor 416, and load transistor 418 coupled as a positive feedback device.

Each of amplifiers 420 and 430 detect a voltage differential on input nodes 460 and 462, and produce an output voltage near either upper power supply node 260 or lower power supply node 262. Outputs from both amplifier stages 420 and 430 are combined to form the output signal "OUT" on node 450. Amplifier stage 130 operates as a level converter to convert the signal levels received to nearly the level of the power supply nodes 260 and 262. The voltages at the power supply nodes are also referred to as the "supply rails."

Amplifier stage 130 operates with high gain and high bandwidth, in part because it is non-linear. An output signal near the supply rails can be produced at the frequency of operation of the earlier amplifier stages 110 and 120. Other non-linear amplifier stages can be utilized for amplifier stage 130 without departing from the scope of the present invention.

Amplifier stage 120 (FIG. 3) is shown having two low impedance nodes (320, 322), and two output signals (A, B). In some embodiments, amplifier stage 120 includes four low impedance nodes, and four output signals, one from each low impedance node. For example, transistor 304 may be coupled to diode-connected transistor 316 to form a first low impedance node, transistor 308 may be coupled to diode-connected transistor 312 to form a second low impedance node, transistor 302 may be coupled to diode-connected transistor 318 to form a third low impedance node, and transistor 306 may be coupled to diode-connected transistor 314 to form a fourth low impedance node. In these embodiments, amplifier stage 120 includes four output nodes, one corresponding to each of the low impedance nodes.

Amplifier stage 130 (FIG. 4) is shown having two input nodes coupled in parallel between amplifiers 420 and 430. In some embodiments, amplifier stage 130 receives four input signals on four separate nodes, with one node connected to one transistor of each differential input transistor pair. For example, in embodiments described in the previous paragraph, amplifier stage 120 provides four output signals from low impedance nodes, and these output signals may be provided separately to the gates of transistors 402, 404, 412, and 414.

Figure 5:
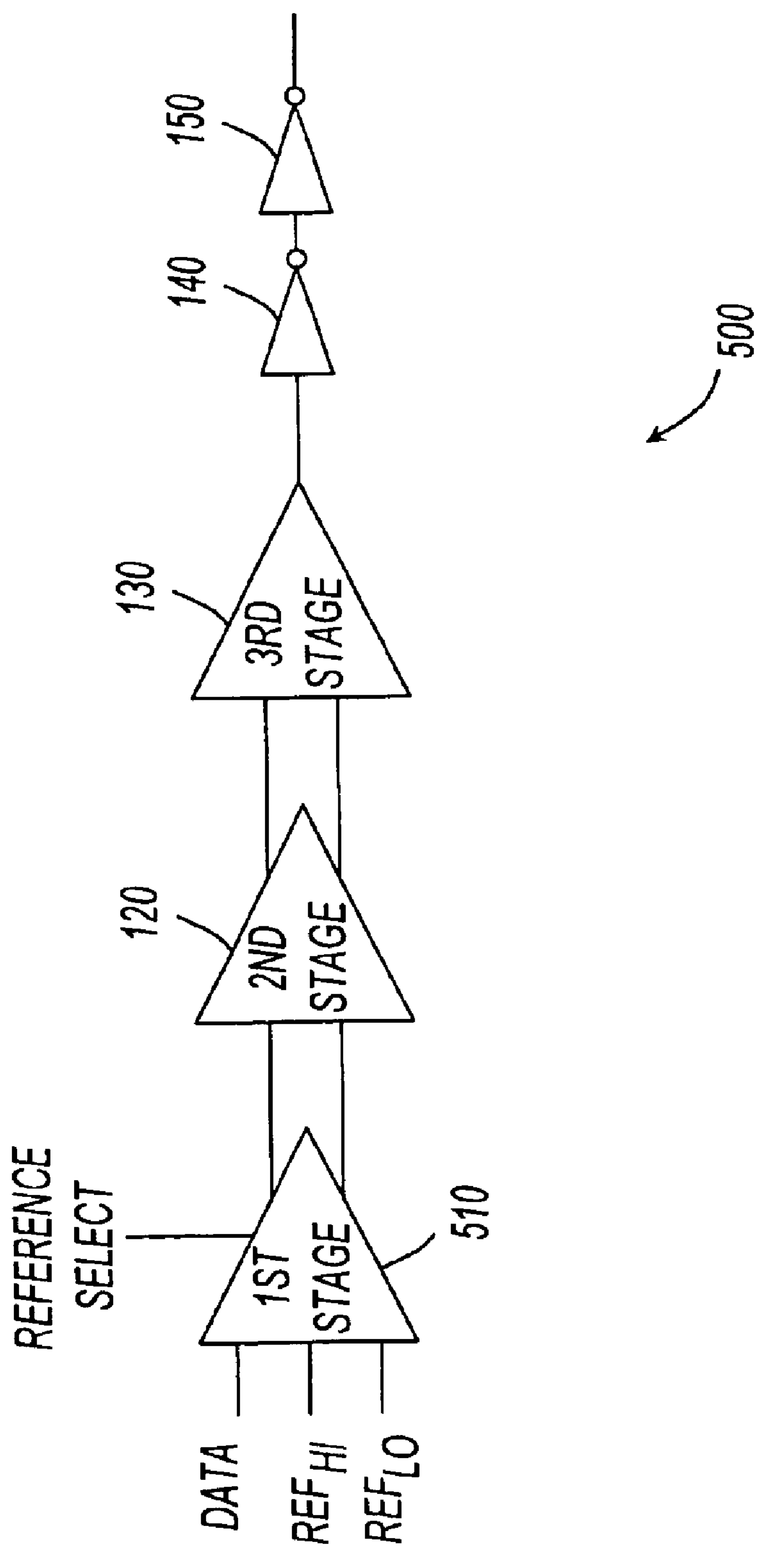
FIG. 5 shows a diagram of a receiver.

FIG. 5 shows a diagram of a receiver. Receiver 500 includes a multi-stage amplifier and inverters 140 and 150. The multi-stage amplifier of receiver 500 includes input stage 510, second stage 120, and third stage 130. Amplifier stages 120 and 130, and inverters 140 and 150 are described above with reference to previous figures. Input stage 510 is similar to input stage 110 (FIGS. 1, 2), but it includes circuitry to select a reference voltage as half of the differential input signal. Input stage 510 is described below with reference to FIG. 6.

Figure 6:
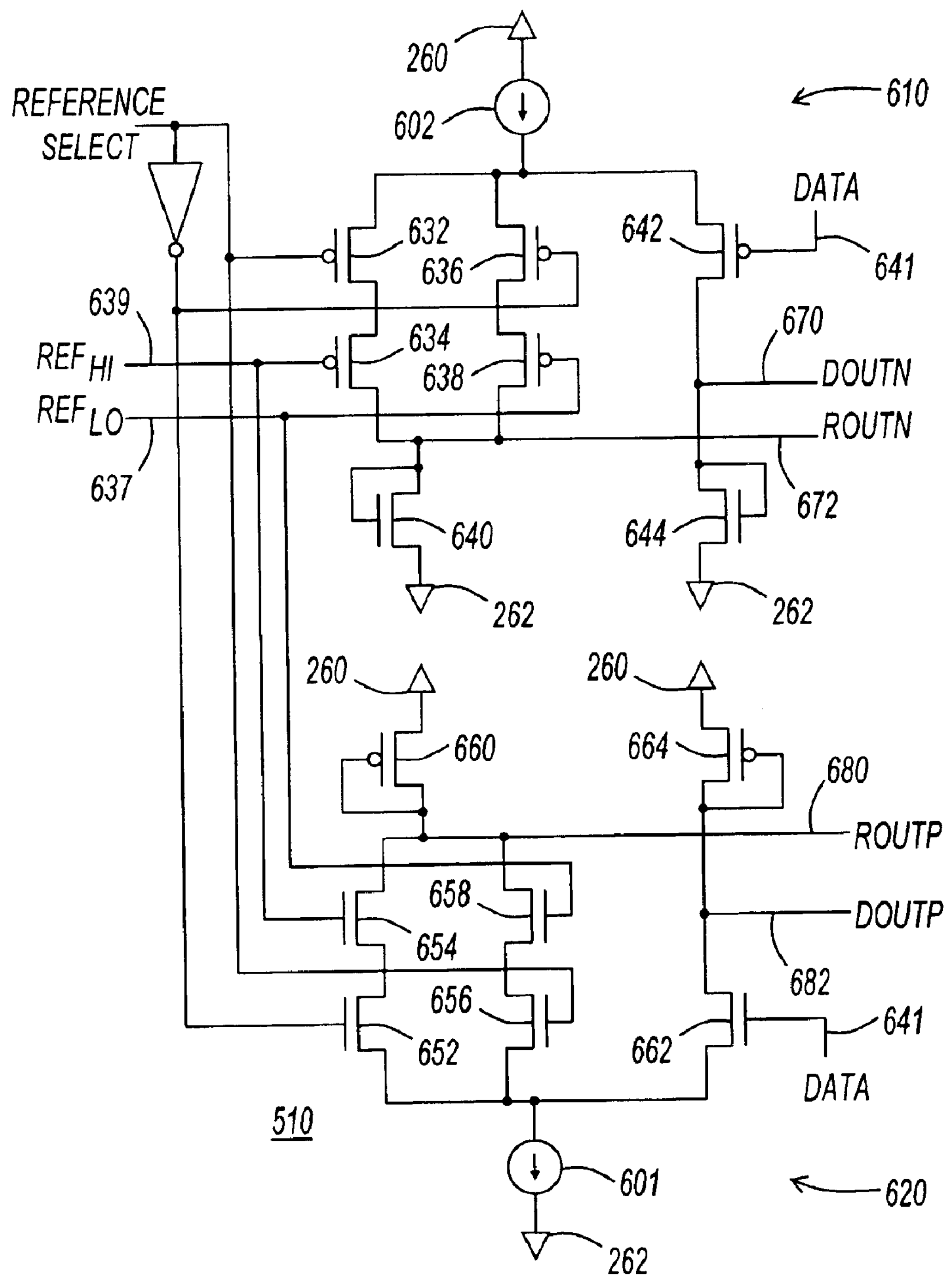
FIG. 6 shows a circuit schematic of an amplifier input stage.

FIG. 6 shows a circuit schematic of an amplifier input stage. Input stage 510 includes complementary differential input amplifiers 610 and 620. Amplifier 610 includes current source 602 and transistors 632, 634, 636, 638, 640, 642 and 644.

Transistors 632 and 636 are pass transistors that select either transistor 634 or transistor 638 to be electrically included in the circuit based on the logic level of signal "REFERENCE SELECT." When REFERENCE SELECT is high, transistor 632 is off, transistor 636 is on, and transistor 638 is in the circuit. In this case, transistors 642 and 638 form a first differential input pair of transistors that receive an input signal ("DATA") on node 641, and a reference voltage ("$REF_{LO}$") on node 637. When REFERENCE SELECT is low, transistor 636 is off, transistor 632 is on, and transistor 634 is in the circuit. In this case, transistors 642 and 634 form the first differential input pair of transistors that receive the input signal on node 641, and a reference voltage ("$REF_{HI}$") on node 639.

The transistors shown in FIG. 6 are shown as isolated gate transistors, and specifically as metal oxide semiconductor field effect transistors (MOSFETs). For example, transistor 642 is shown as a P-type MOSFET, and transistor 644 is shown as an N-type MOSFET. Other types of switching or amplifying elements may be utilized for the various transistors of input stage 510 without departing from the scope of the present invention. For example, the transistors of amplifier 610 may be junction field effect transistors (JFETs), bipolar junction transistors (BJTs), or any device capable of performing as described herein.

Transistors 640 and 644 are "diode-connected" transistors that provide diode loads to the first differential input transistor pair. The diode loads represent relatively low impedance loads that keep the gain of amplifier 610 low. In some embodiments, other load devices are used in input stage 510. For example, in some embodiments, resistors are used in place of transistors 640 and 644, and in other embodiments, diodes are used in place of transistors 640 and 644.

Output signals $D_{OUTN}$ and $R_{OUTN}$ are produced by amplifier 510 on nodes 670 and 672, respectively. The voltage difference between output signal $R_{OUTN}$ and lower power supply node 262 represents the gate-to-source voltage ($V_{GS}$) on transistor 640. The voltage difference between output signal $D_{OUTN}$ and lower power supply node 262 represents the gate-to-source voltage ($V_{GS}$) on transistor 644. $R_{OUTN}$ and $D_{OUTN}$ vary as current is switched between the two load devices based on the action of the first differential input pair.

Amplifier 620 includes current source 601 and transistors 652, 654, 656, 658, 660, 662 and 664. Transistors 652 and 656 are pass transistors that select either transistor 654 or transistor 658 to be electrically included in the circuit based on the logic level of the REFERENCE SELECT signal. When REFERENCE SELECT is high, transistor 652 is off, transistor 656 is on, and transistor 658 is in the circuit. In this case, transistors 662 and 658 form a second differential input pair of transistors that receive the input signal on node 641 and the reference voltage $REF_{LO}$ on node 637. When REFERENCE SELECT is low, transistor 656 is off, transistor 652 is on, and transistor 654 is in the circuit. In this case, transistors 662 and 654 form the second differential input pair of transistors that receive the input signal on node 641 and the reference voltage $REF_{HI}$ on node 639.

Input stage 510 is shown having a mechanism to select between two reference voltage values. In some embodiments, the reference voltage to be used can be selected from more than two possibilities. For example, more pass transistor and input transistor combinations can be in parallel with transistors 652, 654, 656, and 658. Any number of these circuits can be included in parallel, thereby allowing any number of reference voltages to be selectable.

Output signals $R_{OUTP}$ and $D_{OUTP}$ are produced by amplifier 620 on nodes 680 and 682, respectively. The voltage difference between upper power supply node 260 and output signals $R_{OUTP}$ and $D_{OUTP}$ represent the source-to-gate voltages ($V_{SG}$) on the corresponding load device, as current is switched between the two load devices based on the action of the second differential input pair.

Amplifier 610 utilizes P-type transistors for the differential input pair of transistors, and amplifier 620 utilizes N-type transistors for the differential input pair. Accordingly, amplifiers 610 and 620 are referred to as "complementary."

The complementary amplifiers of input stage 510 provide a wide common mode input voltage range. When the input common mode voltage approaches the voltage value of the upper power supply node 260, amplifier 610 may cease to operate, in part because current source 602 may stop sourcing current to the rest of amplifier 610. As amplifier 610 shuts off, amplifier 620 continues to operate. The opposite is true when the input common mode voltage approaches the voltage value of the lower power supply node 262. As the input common mode voltage drops, amplifier 620 may cease to operate, but amplifier 610 will continue to operate.

Figure 7:
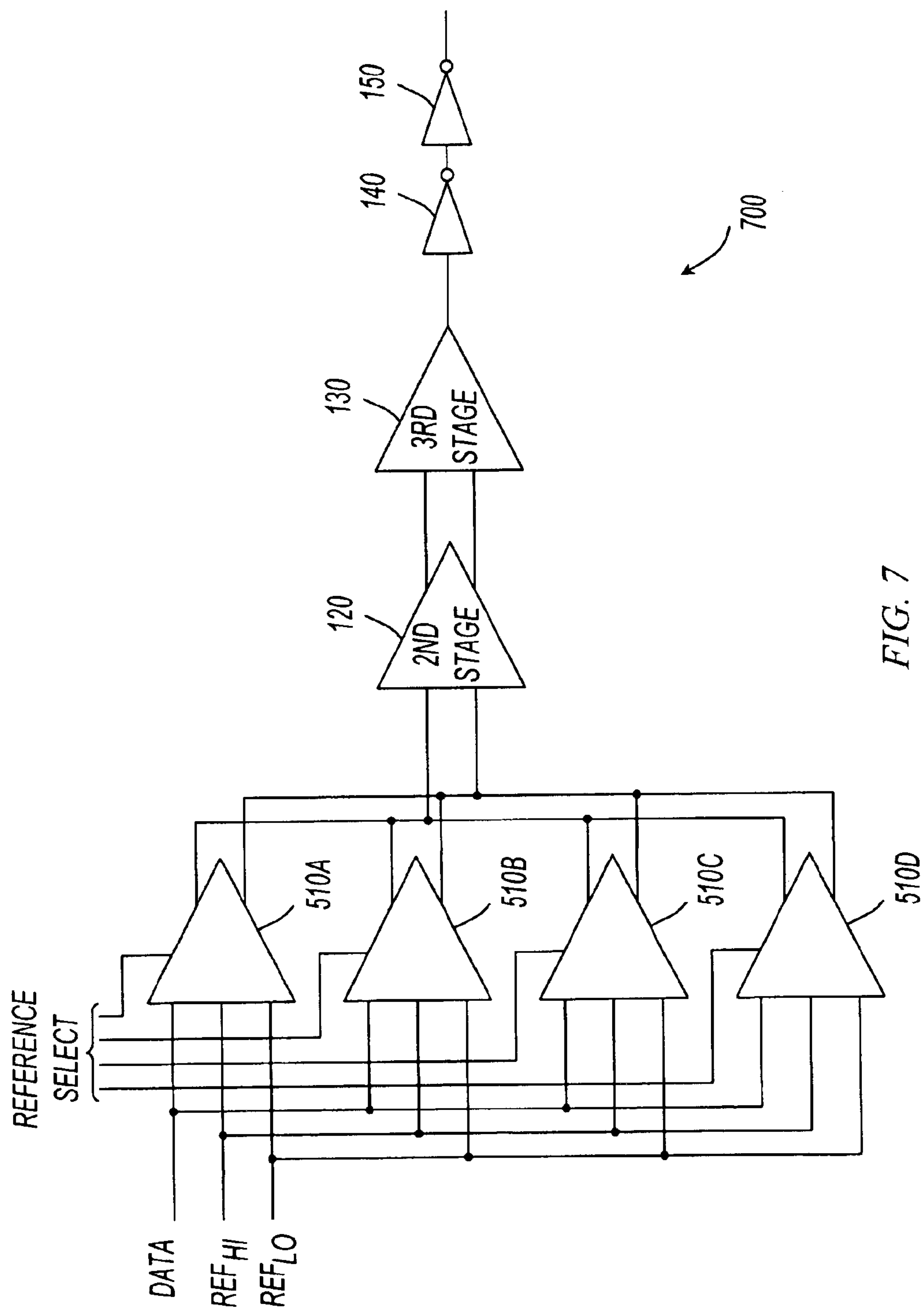
FIG. 7 shows a diagram of a receiver.

FIG. 7 shows a diagram of a receiver. Receiver 700 includes parallel input stages 510A–510D, second stage 120, third stage 130, and inverters 140 and 150. Second stage 120, third stage 130, and inverters 140 and 150 are described above with reference to previous figures.

Input stages 510A–510D are each separate input stages with selectable reference voltages such as input stage 510 (FIG. 6). Input stages 510A–510D are coupled in parallel with respect to the input signals DATA, $REF_{HI}$, and $REF_{LO}$, and the output signals that drive second stage 120. Each of input stages 510A–510D receives a separate REFERENCE SELECT signal. This allows each of the parallel input stages to separately select between $REF_{HI}$ and $REF_{LO}$ for comparison against the DATA signal.

Figure 8:
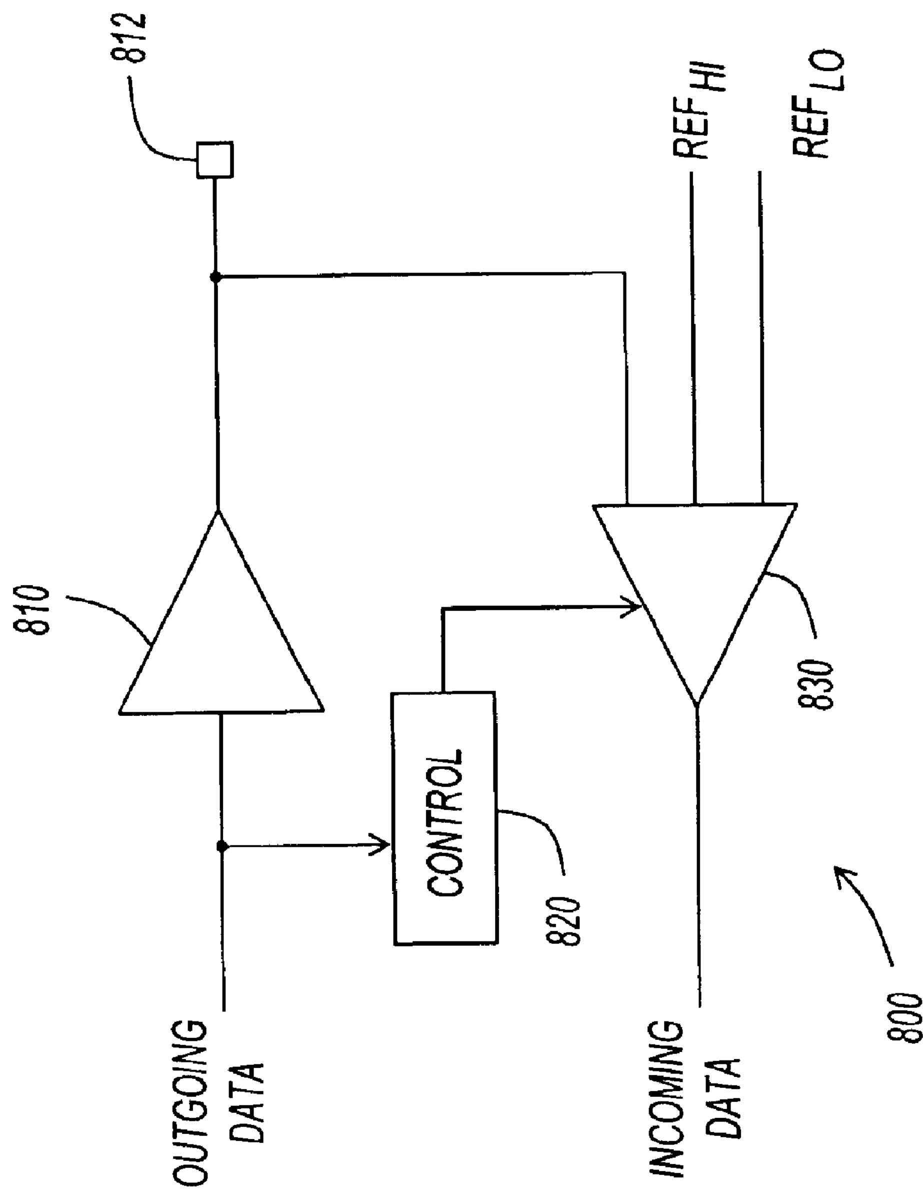
FIG. 8 shows a simultaneous bidirectional port circuit.

FIG. 8 shows a simultaneous bidirectional port circuit. Simultaneous bidirectional port circuit 800 includes output driver 810, control circuit 820, and receiver 830. Output driver 810 drives data onto conductor 812, and receiver 830 receives data from conductor 812. Another simultaneous bidirectional port circuit can be coupled to drive data on conductor 812 in same manner as bidirectional port circuit 800.

Conductor 812 is a simultaneous bidirectional signal node. When two simultaneous bidirectional port circuits are configured to drive data on conductor 812, the voltage on the conductor is the sum of the voltages representing data from both simultaneous bidirectional data ports. Receiver 830 receives the data transmitted by the other simultaneous bidirectional port circuit (not shown) by subtracting the effects of the voltage driven by output driver 810.

Receiver 830 can be implemented using a receiver with a selectable reference, such as receiver 500 (FIG. 5) or receiver 700 (FIG. 7). The selected reference corresponds to the data that is being driven on conductor 812 by driver 810. By utilizing the outbound data to select a reference in receiver 830, the effects of the voltage driven by output driver 810 can be "subtracted" out from the voltage on the simultaneous bidirectional signal node, and receiver 830 can receive the data driven onto conductor 812 by the other port circuit (not shown).

Control circuit 820 receives the data to be driven by driver 810, and provides the REFERENCE SELECT signal to receiver 830. In some embodiments, control circuit 820 includes a buffer or inverter. In these embodiments, the outgoing data effectively serves as the REFERENCE SELECT signal. For example, when receiver 830 includes receiver 500 (FIG. 5), a single REFERENCE SELECT signal is provided to select between $REF_{HI}$ and $REF_{LO}$ in input stage 510. In other embodiments, control circuit 820 includes more circuitry than a buffer or inverter. For example, when receiver 830 includes receiver 700 (FIG. 7), control circuit 820 may provide multiple REFERENCE SELECT signals.

In some embodiments, multiple REFERENCE SELECT signals are provided by control circuit 820. This may be useful when output driver 810 includes a controlled slew rate feature. For example, output driver 810 may drive outgoing data onto conductor 812 at a controlled slew rate to reduce the rise time or fall time of the signal. To "subtract" the effects of the outgoing signal as it transitions with a controlled slew rate, control circuit 820 may assert the multiple REFERENCE SELECT signals in sequence. In these embodiments, control circuit 820 may also provide control signals to output driver 810 to control the outgoing slew rate.

By utilizing receiver 500 (FIG. 5) or receiver 700 (FIG. 7) for receiver 830, the effective gain-bandwidth product of receiver 830 can be increased. This can be useful to allow simultaneous bidirectional port circuits manufactured in a slower process to communicate with simultaneous bidirectional port circuits manufactured in a faster process. The simultaneous bidirectional port circuits in the faster process can have a single stage amplifier for a receiver, whereas the simultaneous bidirectional port circuit in the slower process can have one of the multi-stage amplifiers described herein as the receiver.

Multi-stage amplifiers, receivers, simultaneous bidirectional port circuits and other embodiments of the present invention can be implemented in many ways. In some embodiments, they are implemented in integrated circuits as part of data busses. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, receiver circuit 700 (FIG. 7) can be represented as polygons assigned to layers of an integrated circuit.

Figure 9:
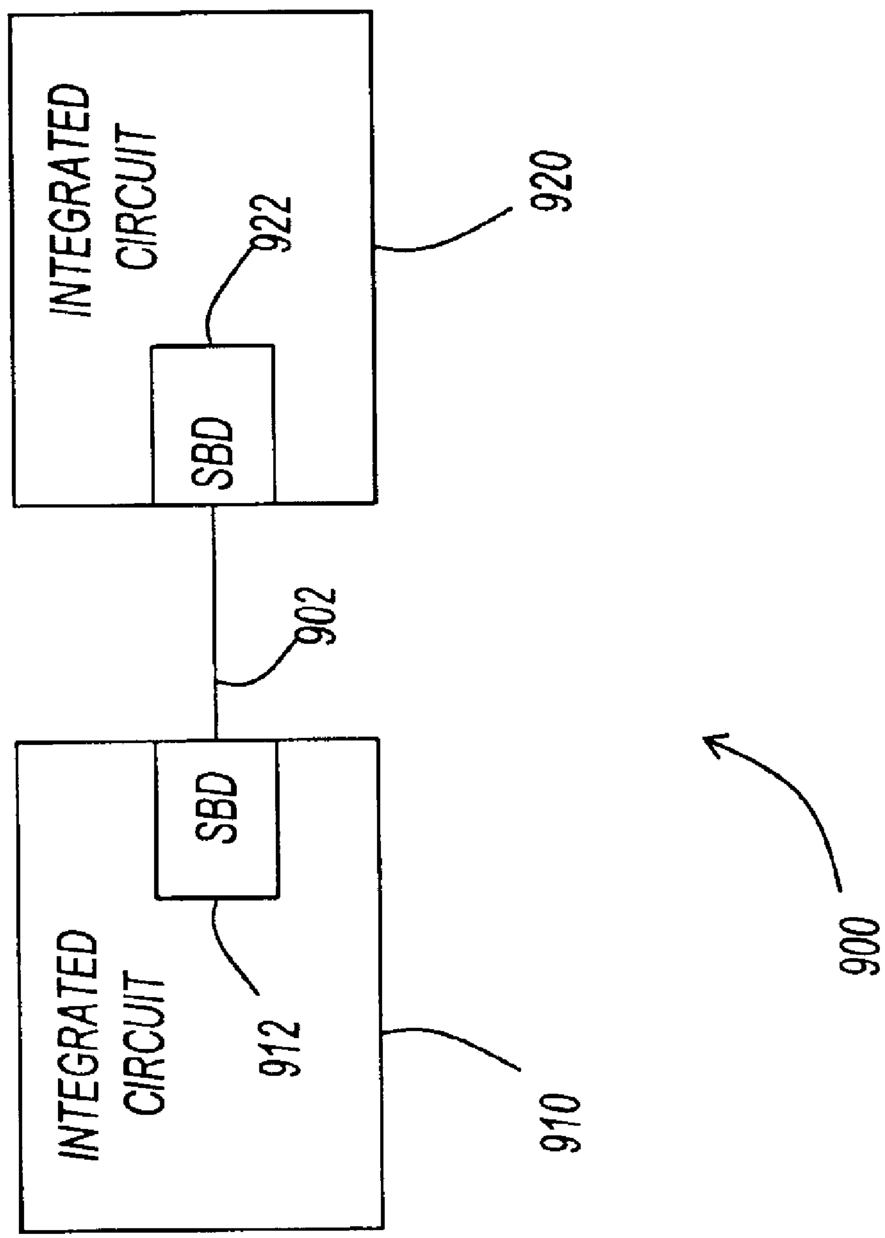
FIGS. 9 and 10 show system diagrams in accordance with various embodiments of the present invention.
Figure 10:
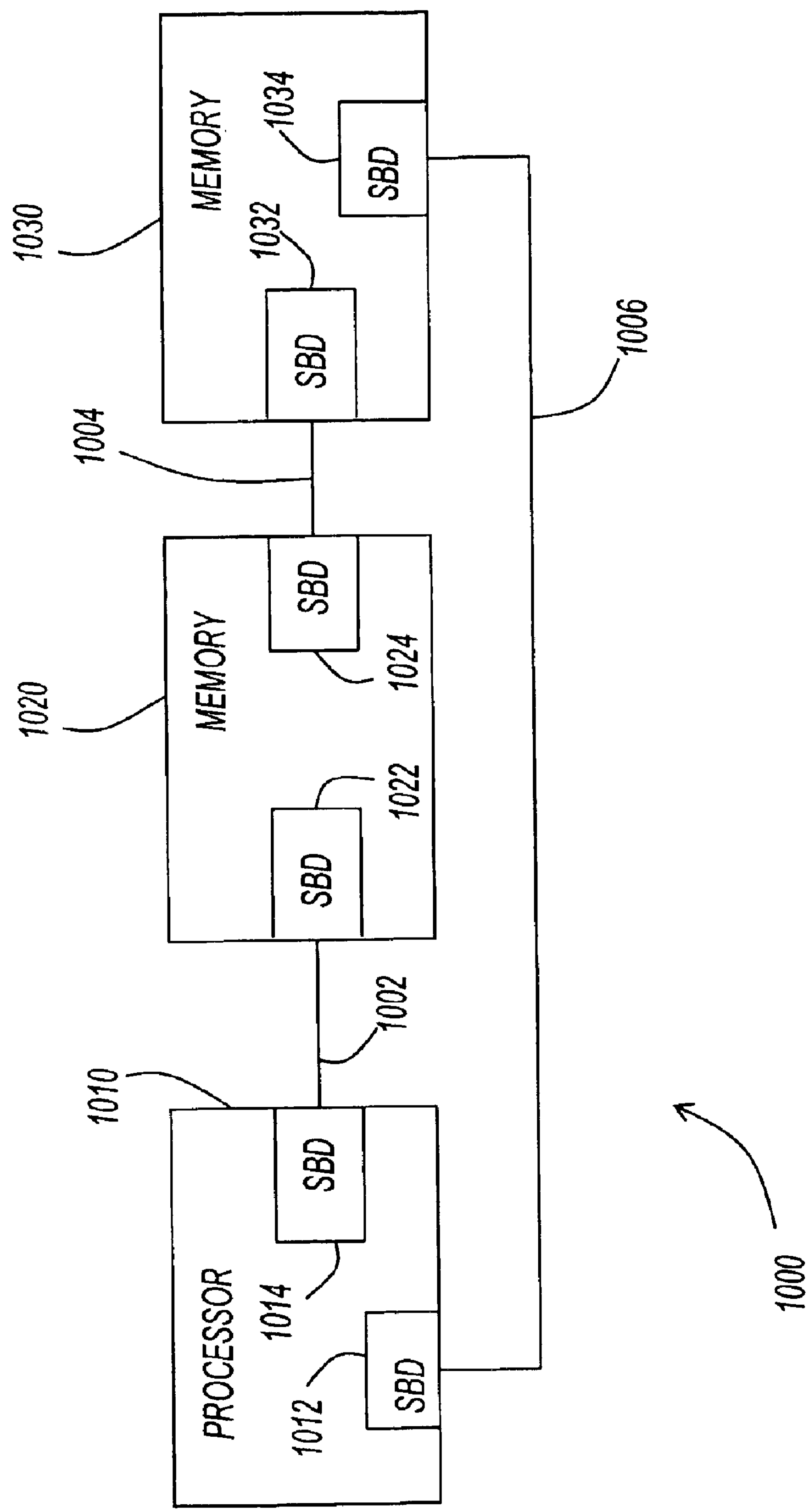

FIGS. 9 and 10 show system diagrams in accordance with various embodiments of the present invention. FIG. 9 shows system 900 including integrated circuits 910 and 920. Integrated circuit 910 includes simultaneous bidirectional (SBD) port circuit 912, and integrated circuit 920 includes SBD port circuit 922. As shown in FIG. 9, both SBD port circuits drive data onto, and receive data from, conductor 902. Conductor 902 serves as a simultaneous bidirectional signal node. One or more of SBD port circuits 912 and 922 can be implemented with SBD port circuit 800 (FIG. 8) that includes one of the multi-stage, high gain-bandwidth amplifiers described herein.

Integrated circuits 910 and 920 can be any type of integrated circuit capable of including one or more SBD port circuits as shown. For example, either integrated circuit 910 or 920 can be a processor such as a microprocessor, a digital signal processor, a microcontroller, or the like. Either integrated circuit can also be an integrated circuit other than a processor such as an application-specific integrated circuit (ASIC), a communications device, a memory controller, or a memory such as a dynamic random access memory (DRAM). For ease of illustration, portions of integrated circuits 910 and 920 are not shown. The integrated circuits may include much more circuitry than illustrated in FIG. 9 without departing from the scope of the present invention.

In some embodiments, integrated circuit 910 includes a processor, SBD port circuit 912 does not include a multi-stage amplifier, integrated circuit 920 includes a memory device, and SBD port circuit 922 does include a multi-stage amplifier of the type described herein. In these embodiments, the use of one of the multi-stage amplifiers in integrated circuit 920 may allow a memory device manufactured in a slower process to communicate with a processor manufactured in a faster process. In other embodiments, SBD port circuits in both integrated circuits include multi-stage amplifiers, regardless of whether processors or memory devices are included.

Integrated circuits 910 and 920 are shown in FIG. 9 having a single SBD port circuit each. In some embodiments, each integrated circuit may have many more SBD port circuits. For example, in some embodiments, entire data busses are driven by banks of SBD port circuits. In other embodiments, nodes for control signals or groups of nodes for control signals are driven by SBD port circuits.

FIG. 10 shows electronic system 1000 including processor 1010 and memories 1020 and 1030. Processor 1010 includes SBD port circuits 1012 and 1014, memory 1020 includes SBD port circuits 1022 and 1024, and memory 1030 includes SBD port circuits 1032 and 1034. One or more of the SBD port circuits shown in FIG. 9 may include a receiver with a multi-stage amplifier, such as receiver 500 (FIG. 5) or receiver 700 (FIG. 7).

Processor 1010, memory 1020, and memory 1030 are configured in a ring such that each device communicates with two others using at least one SBD port circuit coupled to a simultaneous bidirectional signal node. For example, processor 1010 communicates with memory 1020 using SBD port circuit 1014 coupled to simultaneous bidirectional signal node 1002, and also communicates with memory 1030 using SBD port circuit 1012 coupled to simultaneous bidirectional signal node 1006. Also for example, memory device 1020 communicates with memory device 1030 using SBD port circuit 1024 coupled to simultaneous bidirectional signal node 1004.

Processor 1010 and memory devices 1020 and 1030 are shown in FIG. 10 having two SBD port circuits each. In some embodiments, each device may have many more SBD port circuits. For example, in some embodiments, entire data busses are driven by banks of SBD port circuits. In other embodiments, nodes for control signals or groups of nodes for control signals are driven by SBD port circuits.

In some embodiments, processor 1010 is part of one integrated circuit die, memory device 1020 is part of a second integrated circuit die, and memory device 1030 is part of a third integrated circuit die. In these embodiments, each of the integrated circuit dice may be separately packaged and mounted on a common circuit board. Each of the integrated circuits may also be separately packaged and mounted on separate circuit boards interconnected by the simultaneous bidirectional signal nodes. In other embodiments, processor 1010 and memory devices 1020 and 1030 are separate integrated circuit dice packaged together, such as in a multi-chip module.

FIG. 10 shows one processor and two memory devices. In some embodiments, many more memory devices are included. Further, any number of processors can be included. In other embodiments, circuit types other than processors and memory devices are included in system 1000.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 11:
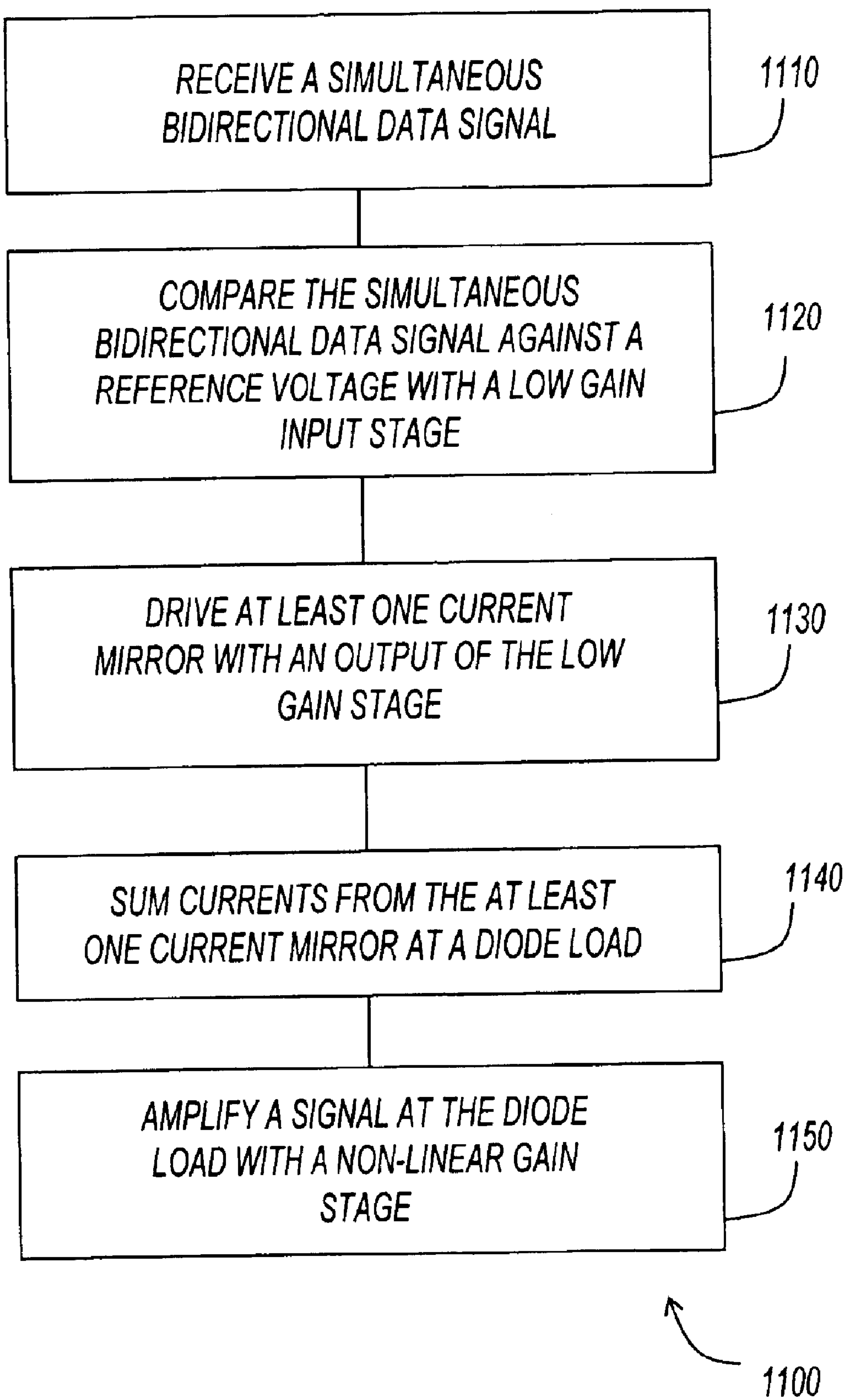
FIG. 11 shows a flowchart in accordance with various embodiments of the present invention.

FIG. 11 shows a flowchart in accordance with various embodiments of the present invention. In some embodiments, method 1100, or portions thereof, is performed by a multi-stage amplifier, embodiments of which are shown in previous figures. In other embodiments, method 1100 is performed by a simultaneous bidirectional port circuit, an integrated circuit, or an electronic system. Method 1100 is not limited by the particular type of apparatus performing the method. The various actions in method 1100 may be performed in the order presented, or may be performed in a different order. Further, in some embodiments, some actions listed in FIG. 11 are omitted from method 1100.

Method 1100 is shown beginning with block 1110 in which a simultaneous bidirectional data signal is received, and in block 1120, the simultaneous bidirectional data signal is compared against a reference voltage with a low gain input stage. The actions in these blocks correspond to the operation of input stage 110 (FIGS. 1, 2) or input stage 510 (FIGS. 5, 6). These actions may also correspond to a parallel combination of input stages such as those shown in FIG. 7. In some embodiments, the comparing action includes selecting a reference voltage from a plurality of reference voltages. For example, a reference voltage may be selected using input stage 510 (FIG. 6).

In block 1130, at least one current mirror is driven with an output of the low gain stage, and in block 1140, currents from the at least one current mirror are summed at a diode load. The actions of blocks 1130 and 1140 correspond to the operation of second stage 120 (FIG. 3). In block 1150, a signal at the diode load is amplified with a non-linear gain stage, such as third stage 130 (FIG. 4).

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An amplifier circuit comprising:

an input stage having a low impedance load and an output node to provide an output signal from the low impedance load, wherein the low-impedance load of the input stage comprises a diode-connected transistor; and a second stage including an active device coupled to receive the output signal from the low impedance load of the input stage, and including a diode load coupled to the active device, wherein the active device comprises a current mirror transistor to mirror current in the diode-connected transistor.

2. The amplifier circuit of claim 1 wherein:

the input stage includes first and second input transistors configured as a differential input pair; and the second stage includes first and second current mirror transistors coupled to the first and second input transistors.

3. The amplifier circuit of claim 2 further comprising first and second diode-connected transistors coupled as load devices to the first and second input transistors.

4. The amplifier circuit of claim 1 further comprising a non-linear third stage coupled to the diode load of the second stage.

5. The amplifier circuit of claim 1 wherein the input stage includes complementary differential input circuits having input nodes coupled in parallel.

6. The amplifier circuit of claim 1 wherein the input stage includes a differential input stage having a selectable reference.

7. A method comprising:

receiving a simultaneous bidirectional data signal;

comparing the simultaneous bidirectional data signal against a reference voltage with a low gain input stage;

driving at least one current mirror with an output of the low gain stage; and summing currents from the at least one current mirror at a diode load.

8. The method of claim 7 wherein comparing comprises selecting the reference voltage from a plurality of reference voltages.

9. The method of claim 7 further comprising amplifying a signal at the diode load with a non-linear gain stage.

10. The method of claim 7 wherein comparing comprises:

comparing with a low gain input stage that includes complementary differential input transistor pairs with parallel input nodes and multiple output nodes.

11. The method of claim 10 wherein driving at least one current mirror comprises driving a separate current mirror for each of the multiple output nodes.

12. The method of claim 11 wherein summing comprises summing currents from the separate current mirrors to form a differential output node.

13. An amplifier circuit comprising:

an input stage to receive a data signal, a high reference voltage, and a low reference voltage, the input stage including: a first input transistor to receive the data signal; a first diode connected transistor to provide a load to the first input transistor; a pair of selectable input transistors to receive the high reference voltage and low reference voltage; and a second diode connected transistor coupled to provide a load to the pair of selectable input transistors; and a second stage including a first current mirror transistor coupled to the first diode connected transistor of the input stage; a second current mirror transistor coupled to the second diode connected transistor of the input stage; and diode loads coupled to the first and second current mirror transistors; and a high gain third stage coupled to receive signals from the diode loads of the second stage.

14. The amplifier circuit of claim 13 wherein the input stage comprises two complementary differential input amplifiers to provide four output signals from diode loads.

15. The amplifier circuit of claim 14 wherein the second stage includes four current mirror transistors coupled to be responsive to the four output signals of the input stage.

16. The amplifier circuit of claim 15 wherein the diode loads of the second stage are coupled to the four current mirror transistors to sum currents from the four current mirror transistors at two summing points, and to provide two output signals to the third stage.

17. The amplifier of claim 13 further comprising select transistors coupled between the pair of selectable transistors and the second diode connected transistor.

* * * * *

UNITED STATES PATENT AND TRADEMARK OFFICE

CERTIFICATE OF CORRECTION

PATENT NO. : 6,933,781 B2
DATED : August 23, 2005
INVENTOR(S) : James E. Jaussi, Joseph T. Kennedy and Stephen R. Mooney It is certified that error appears in the above-identified patent and that said Letters Patent is hereby corrected as shown below:

Title page,
Item [56], References Cited, OTHER PUBLICATIONS, "Barrandon G." reference, after "Barrandon" insert -- , --; delete "Performance" and insert -- Performances --, therefor; and delete "Amterdam" and insert -- Amsterdam --, therefor.

Signed and Sealed this

Eighteenth Day of October, 2005

JON W. DUDAS
*Director of the United States Patent and Trademark Office*